United States Patent
Mont et al.

(10) Patent No.: US 10,658,176 B2
(45) Date of Patent: May 19, 2020

(54) METHODS OF MITIGATING COBALT DIFFUSION IN CONTACT STRUCTURES AND THE RESULTING DEVICES

(71) Applicant: GLOBALFOUNDRIES Inc., Grand Cayman (KY)

(72) Inventors: Frank W. Mont, Troy, NY (US); Han You, Cohoes, NY (US); Shariq Siddiqui, Albany, NY (US); Brown C. Peethala, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/123,042

(22) Filed: Sep. 6, 2018

(65) Prior Publication Data

US 2020/0083040 A1    Mar. 12, 2020

(51) Int. Cl.
*H01L 21/76* (2006.01)
*H01L 21/02* (2006.01)
*H01L 21/285* (2006.01)

(52) U.S. Cl.
CPC .. *H01L 21/02581* (2013.01); *H01L 21/02115* (2013.01); *H01L 21/02247* (2013.01); *H01L 21/02362* (2013.01); *H01L 21/28506* (2013.01)

(58) Field of Classification Search
CPC ......... H01L 21/02581; H01L 21/02115; H01L 21/02247; H01L 21/02362; H01L 21/28506

USPC ......................................................... 438/400
See application file for complete search history.

(56) References Cited

U.S. PATENT DOCUMENTS

| | | | |
|---|---|---|---|
| 9,576,901 B1 * | 2/2017 | Chen ................ | H01L 21/76811 |
| 9,754,883 B1 * | 9/2017 | Briggs ............... | H01L 21/7685 |
| 9,859,215 B1 * | 1/2018 | Edelstein .......... | H01L 21/76843 |
| 2015/0235957 A1 * | 8/2015 | Zhang ............... | H01L 23/53266 |
| | | | 257/751 |
| 2015/0287593 A1 * | 10/2015 | Canaperi .......... | H01L 21/02274 |
| | | | 257/288 |
| 2016/0118296 A1 * | 4/2016 | Kolics .............. | H01L 21/76807 |
| | | | 438/653 |
| 2017/0194558 A1 * | 7/2017 | Lee ................... | G06F 3/0611 |
| 2017/0263557 A1 | 9/2017 | Clevenger et al. | |

* cited by examiner

*Primary Examiner* — Vu A Vu
(74) *Attorney, Agent, or Firm* — Amerson Law Firm, PLLC

(57) ABSTRACT

One illustrative method disclosed includes, among other things, forming a first dielectric layer and forming first and second conductive structures comprising cobalt embedded in the first dielectric layer. A second dielectric layer is formed above and contacting the first dielectric layer. The first and second dielectric layers comprise different materials, and a portion of the second dielectric layer comprises carbon or nitrogen. A first cap layer is formed above the first and second conductive structures and the second dielectric layer.

18 Claims, 4 Drawing Sheets

METHODS OF MITIGATING COBALT DIFFUSION IN CONTACT STRUCTURES AND THE RESULTING DEVICES

BACKGROUND

1. Field of the Disclosure

The present disclosure generally relates to the fabrication of integrated circuits, and, more particularly, to various novel methods of mitigating cobalt diffusion in contact structures and the resulting devices.

2. Description of the Related Art

In modern integrated circuits, such as microprocessors, storage devices and the like, a very large number of circuit elements, especially field effect transistors (FETs), are formed and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

There are various device level contacts formed on an IC product to establish electrical connection to the various semiconductor devices formed on the substrate. Different contact materials have been employed to facilitate the contacts. A problem has been identified with contacts that employ cobalt that are formed in dielectric layers, such as silicon dioxide. Such contacts are typically covered with a cap layer. At some point in the process for forming the cap layer, the cobalt migrates along the surface of the silicon dioxide, potentially causing shorts between adjacent contacts or other reliability concerns, such as time-dependent dielectric breakdown (TDDB).

SUMMARY

The present disclosure is directed to various methods and devices that may avoid, or at least reduce, the effects of one or more of the problems identified above.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of cobalt contacts and various novel device structures. One illustrative method disclosed includes, among other things, forming a first dielectric layer and forming first and second conductive structures comprising cobalt embedded in the first dielectric layer. A second dielectric layer is formed above and contacting the first dielectric layer. The first and second dielectric layers comprise different materials, and a portion of the second dielectric layer comprises carbon or nitrogen. A first cap layer is formed above the first and second conductive structures and the second dielectric layer.

One illustrative novel device disclosed includes, among other things, a first dielectric layer, first and second conductive structures comprising cobalt embedded in the first dielectric layer, and a second dielectric layer positioned above and contacting the first dielectric layer. The first and second dielectric layers include different materials, and a portion of the second dielectric layer includes carbon or nitrogen. A first cap layer is positioned above the first and second conductive structures and contacting the second dielectric layer.

BRIEF DESCRIPTION OF THE DRAWINGS

The disclosure may be understood by reference to the following description taken in conjunction with the accompanying drawings, in which like reference numerals identify like elements, and in which.

Figure 1A:
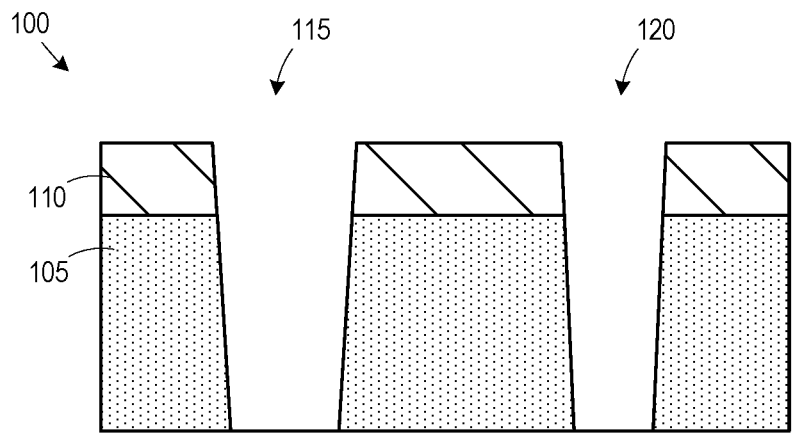
FIGS. 1A-1C depict various novel methods disclosed herein of forming cobalt contact structures using a stack of dielectric layers, in accordance with some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1A is a cross-sectional view of an illustrative IC product 100. The product includes a first dielectric layer 105 (e.g., silicon dioxide formed using a plasma enhanced chemical vapor deposition process, a TEOS deposition process, or high density plasma process, or a low temperature process) and a second doped dielectric layer 110 formed above the first dielectric layer 105. Contact openings 115, 120 are defined in the dielectric layers 105, 110. A patterned hard mask (not shown) may be formed above the second doped dielectric layer 110 and used as an etch template for forming the contact openings 115, 120.

Figure 1B:
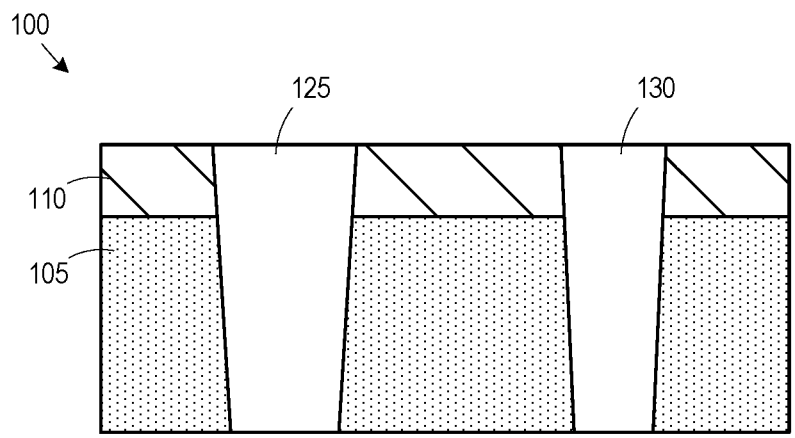

FIG. 1B illustrates the product 100 after several processes were performed to form cobalt contacts 125, 130 in the contact openings 115, 120. For example, a deposition process was performed to form a cobalt layer in the contact openings 115 and 120 and above the second doped dielectric layer 110. Subsequently, a planarization process was performed to remove portions of the cobalt layer extending beyond the contact openings 115, 120. The cobalt contacts 125, 130 may be formed above underlying conductive elements (not shown), such as other contacts, conductive lines, gate electrodes, source/drain contacts, etc. The cobalt contacts 125, 130 may have different depths and or widths. In some embodiments, the cobalt contacts 125, 130 may include a liner/barrier stack (not separately shown) formed in the contact openings 115, 120 prior to depositing the cobalt fill material. Example liner/barrier materials include Ti/TiN, Ta/TaN, Ta/Ra, Ta/Co, Ru/Co, etc.

Figure 1C:
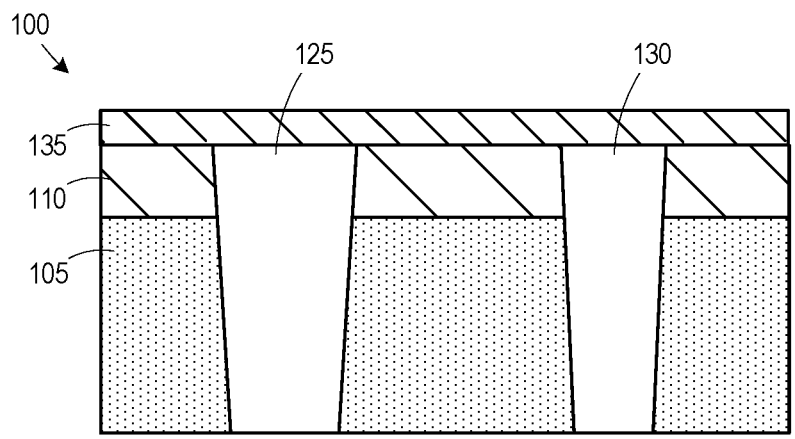

FIG. 1C illustrates the product 100 after a deposition process was performed to form a cap layer 135 above the cobalt contacts 125, 130 and the second doped dielectric layer 110. In some embodiments, the deposition process may be performed at a relatively high temperature, such as a temperature greater than 200° C., for cap materials such as SiCN or SiNO. In some embodiments, the cap layer 135 may be a layer of SiCN or a bi-layer including SiCN and SiNO over the SiCN. The dopant in the second doped dielectric layer 110 inhibits the migration of cobalt along its upper surface during the formation of the cap layer 135 (e.g., pre-heating, deposition). Example dopants for the second doped dielectric layer 110 include carbon, nitrogen, or both. In some embodiments, the second doped dielectric layer 110 may be SiCOH, porous SiCOH, porous SiNCH, or SiN.

Figure 2A:
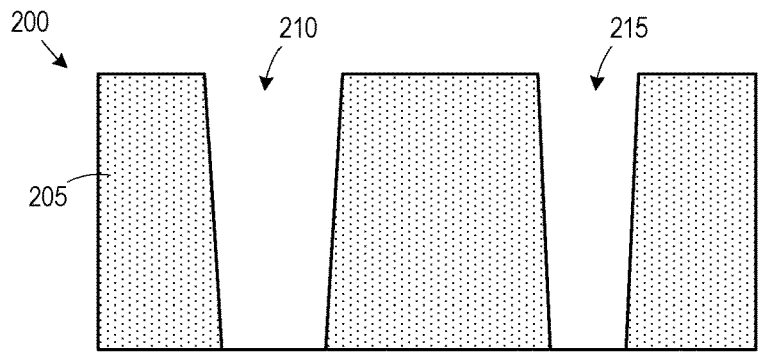
FIGS. 2A-2D depict various novel methods disclosed herein of forming cobalt contact structures using a surface treatment on a dielectric layer, in accordance with some embodiments.

FIGS. 2A-2D illustrate an alternative process flow for forming a product 200. In FIG. 2A, a first dielectric layer 205 (e.g., silicon dioxide) is provided and contact openings 210, 215 are formed in the first dielectric layer 205.

Figure 2B:
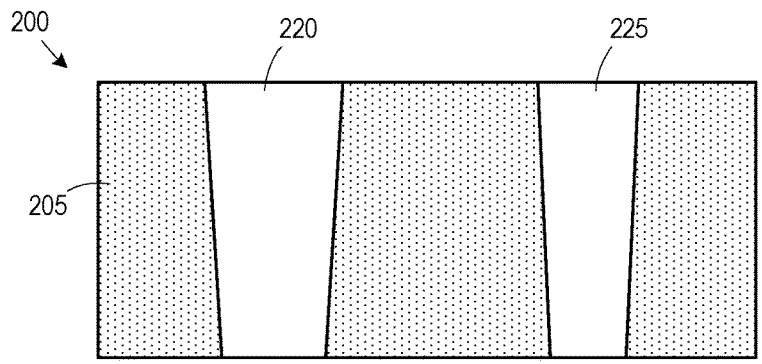

FIG. 2B illustrates the product 200 after several processes were performed to form cobalt contacts 220, 225 in the contact openings 210, 215 (as described above in FIG. 1B).

Figure 2C:
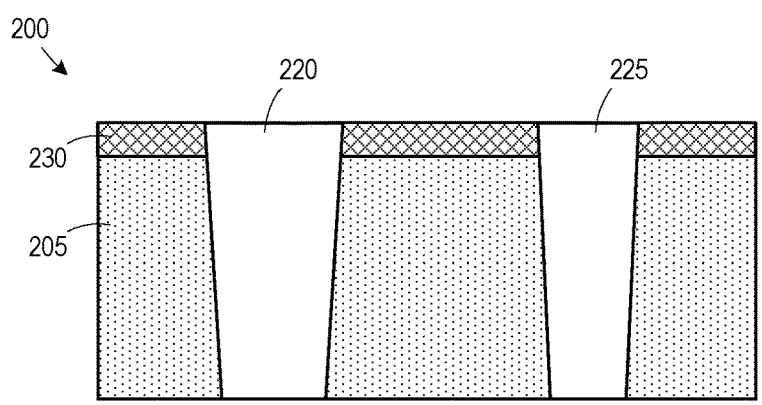

FIG. 2C illustrates the product 200 after a treatment process was performed to form a second doped dielectric layer 230 in a portion of the first dielectric layer 205. The treatment process may include an implantation process to introduce carbon or a nitridation process using UV-NH$_3$ or N$_2$ plasma to introduce nitrogen.

Figure 2D:
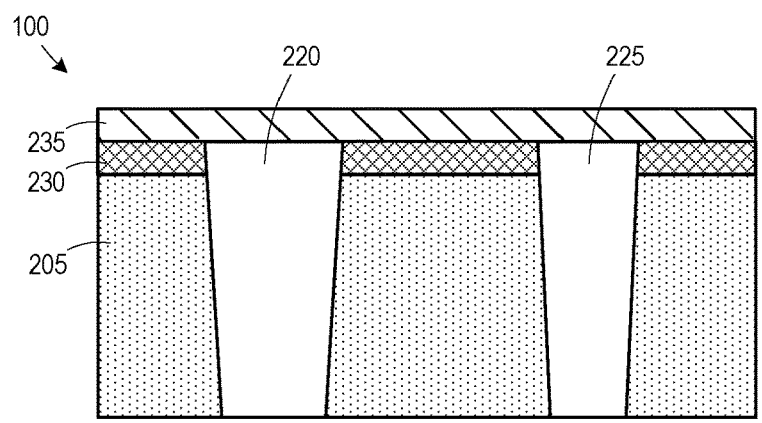

FIG. 2D illustrates the product 200 after a deposition process was performed to form a cap layer 235 above the cobalt contacts 220, 225 and the second doped dielectric layer 230. The cap layer 235 may be similar to the cap layer 135 described in reference to FIG. 1C. Again, the dopant in the second doped dielectric layer 230 inhibits the migration of cobalt along its upper surface during the formation of the cap layer 235.

Figure 3A:
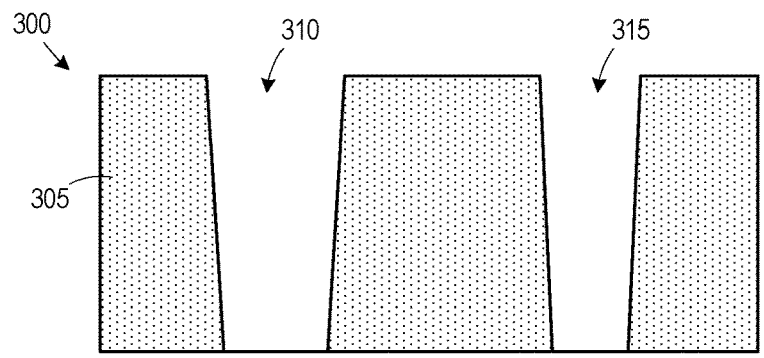
FIGS. 3A-3D depict various novel methods disclosed herein of forming cobalt contact structures by forming a self-assembled monolayer on a dielectric layer, in accordance with some embodiments.

FIGS. 3A-3D illustrate an alternative process flow for forming a product 300. In FIG. 3A, a first dielectric layer 305 (e.g., silicon dioxide) is provided and contact openings 310, 315 are formed in the first dielectric layer 305.

Figure 3B:
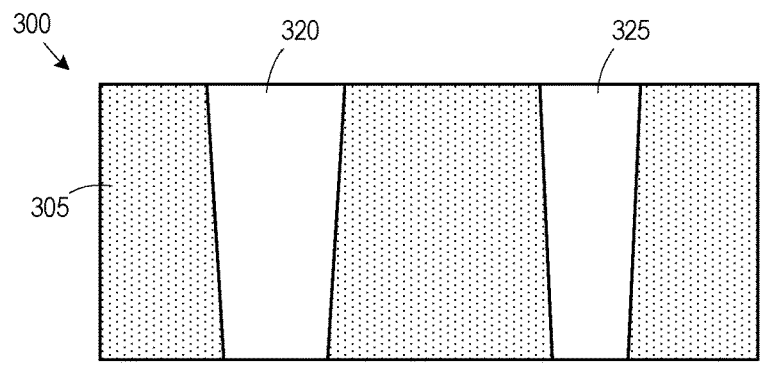

FIG. 3B illustrates the product 300 after several processes were performed to form cobalt contacts 320, 325, in the contact openings 310, 315 (as described above in FIG. 1B).

Figure 3C:
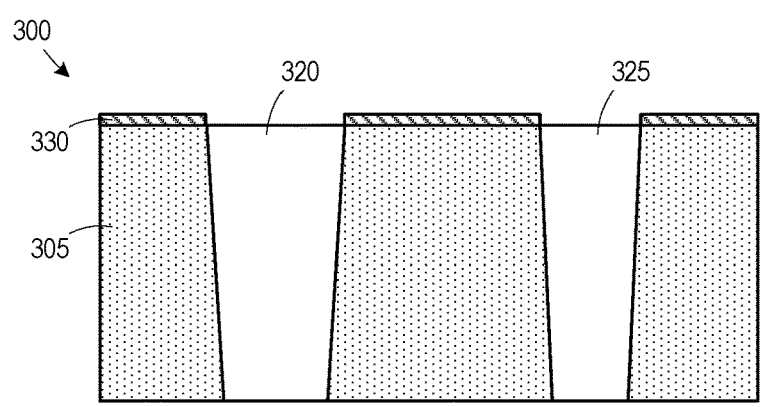

FIG. 3C illustrates the product 300 after a deposition process was performed to form a self-assembled monolayer 330 above the first dielectric layer 305 and between the cobalt contacts 320, 325. The self-assembled monolayer 330 may be an alkylsilane material, such as:

octadecyltrichlorosilane ((CH$_3$(CH$_2$)17SiCl$_3$) or
tridecafluoro-1,1,2,2-tetrahydrooctyltrichlorosilane (CF$_3$(CF$_2$)5(CH$_2$)2SiCl$_3$), or an alkene, such as:
1-octadecene (CH$_3$(CH$_2$)15(CH)CH$_2$).

The liquid phase (room temperature) and the vapor phase (<100° C.) of the materials for the self-assembled monolayer 330 are sufficiently low that migration of cobalt does not occur during the deposition process. The self-assembled monolayer 330 selectively forms on the first dielectric layer 305 without forming on the cobalt contacts 320, 325.

Figure 3D:
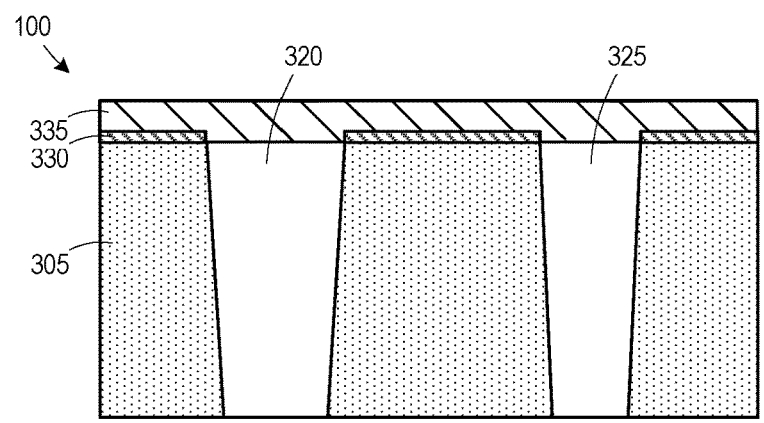

FIG. 3D illustrates the product 300 after a deposition process was performed to form a cap layer 335 above the cobalt contacts 320, 325 and the self-assembled monolayer 330. The cap layer 335 may be similar to the cap layer 135 described in reference to FIG. 1C. The carbon in the self-assembled monolayer 330 inhibits the migration of cobalt along its upper surface during the formation of the cap layer 335.

Figure 4A:
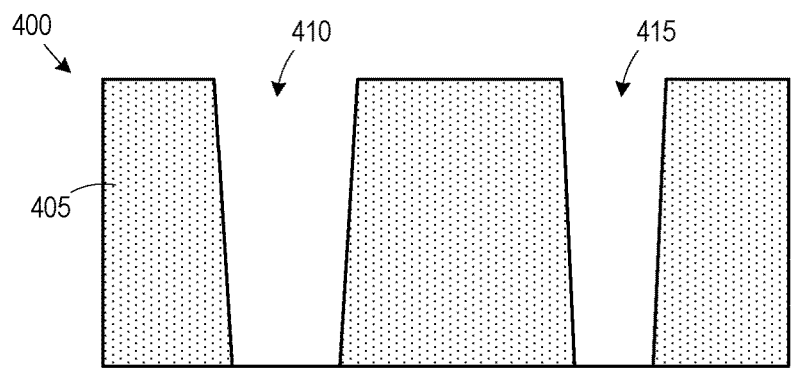
FIGS. 4A-4D depict various novel methods disclosed herein of forming cobalt contact structures using a low temperature cap layer, in accordance with some embodiments.

FIGS. 4A-4D illustrate an alternative process flow for forming a product 400. In FIG. 4A, a first dielectric layer 405 (e.g., silicon dioxide) is provided and contact openings 410, 415 are formed in the first dielectric layer 405.

Figure 4B:
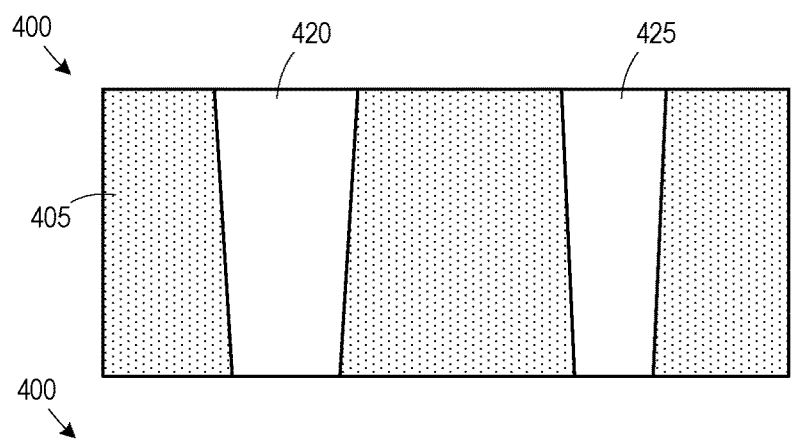

FIG. 4B illustrates the product 400 after several processes were performed to form cobalt contacts 420, 425, in the contact openings 410, 415 (as described above in FIG. 1B).

Figure 4C:
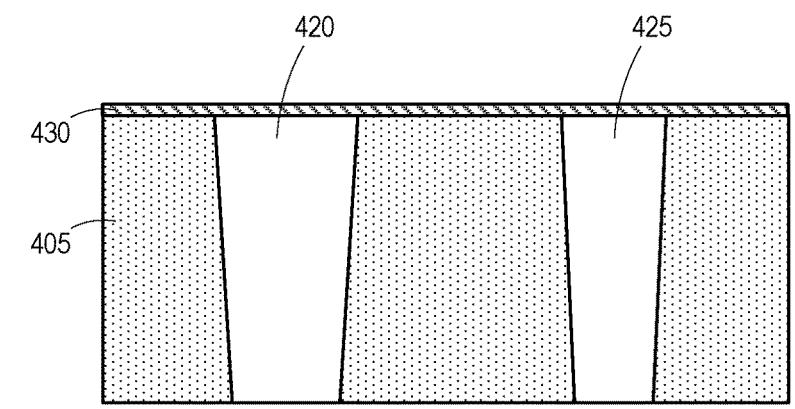

FIG. 4C illustrates the product 400 after a first cap layer 430 is formed above the first dielectric layer 405 and the cobalt contacts 420, 425. The first cap layer 430 is formed using a low temperature process (e.g., room temperature or below 200° C.), and the first cap layer is doped with carbon or nitrogen. Example low-temperature cap layer formation processes include room temperature or low temperature SiNCH or SiBCN deposition processes.

Figure 4D:
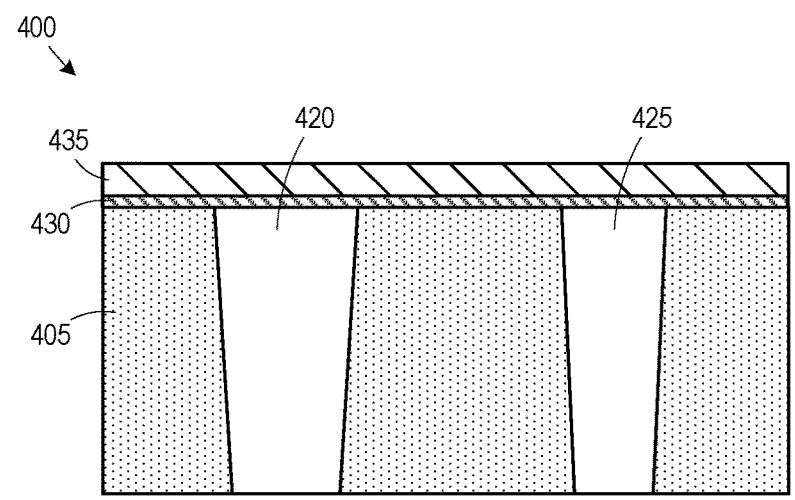

FIG. 4D illustrates the product 400 after a deposition process was performed to form a second cap layer 435 above the first cap layer 430. In some embodiments, the second cap layer 435 may be a graded extension of the first cap layer 430 with different dopant concentration (not a separate layer, as shown in FIG. 4D). The process parameters may be changed during the deposition process to achieve the grading. In other embodiments, the second cap layer 435 may be similar to the cap layer 135 described in reference to FIG. 1C. The dopant in the first cap layer 430 inhibits the migration of cobalt.

In the various embodiments described herein, a second layer 110, 230, 330, 430 doped with carbon or nitrogen is provided on a surface of the first dielectric layer 105, 205, 305, 405 formed between the first and second cobalt contacts 125/130, 220/225, 320/325, 420/425. The dopant level may be between 10% and 50% by atomic concentration. The dopant inhibits the migration of cobalt over the surface of the first dielectric layer 105, 205, 305, 405 during the subsequent formation of a cap layer 135, 235, 335, 435.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modifeed and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a first dielectric layer;
   forming first and second conductive structures comprising cobalt embedded in the first dielectric layer;
   forming a second cap layer above and directly contacting an uppermost surface of the first dielectric layer after forming the first and second conductive structures, wherein the first dielectric layer and the second cap layer comprise different materials, and a portion of the second cap layer comprises a second concentration carbon or nitrogen; and
   forming a first cap layer above the first and second conductive structures and the second cap layer, wherein the first cap layer comprises a first concentration of carbon or nitrogen and the first cap layer is an extension of the second cap layer, and wherein the first concentration of carbon or nitrogen in the first cap layer is less than the second concentration of the carbon or nitrogen in the second cap layer.

2. The method of claim 1, wherein forming the second cap layer comprises performing a surface treatment on the first dielectric layer.

3. The method of claim 2, wherein the surface treatment comprises a carbon implantation.

4. The method of claim 2, wherein the surface treatment comprises a nitridation process.

5. The method of claim 1, wherein forming the second cap layer comprises forming a self-assembled monolayer comprising carbon on surfaces of the first dielectric layer after forming the first and second conductive structures and prior to forming the first cap layer.

6. The method of claim 1, wherein the first dielectric layer comprises silicon dioxide, and the second cap layer comprises one of SiCOH, SiNCH, or SiN.

7. The method of claim 1, wherein forming the second cap layer comprises forming a second cap layer that directly contacts the first dielectric layer and the first and second conductive structures using a process temperature less than 200° C.

8. The method of claim 1, wherein the first dielectric layer is silicon dioxide.

9. The method of claim 1, wherein the first cap layer is formed using a deposition process having a temperature greater than 200° C.

10. The method of claim 1, wherein the first cap layer comprises a SiNO layer formed above a SiCN layer.

11. The method of claim 1, wherein a concentration of the carbon or nitrogen in the second cap layer is between 10% and 50% by atomic species.

12. A device, comprising:
    a first dielectric layer;
    first and second conductive structures comprising cobalt embedded in the first dielectric layer;
    a second dielectric layer positioned above an uppermost surface of the first dielectric layer and directly contacting the first dielectric layer adjacent uppermost surfaces of the first and second conductive features, wherein the first and second dielectric layers comprise different materials, and a portion of the second dielectric layer comprises carbon or nitrogen, wherein the second dielectric layer comprises a self-assembled monolayer, the self-assembled monolayer comprising carbon and directly contacting surfaces of the first dielectric layer; and
    a first cap layer that directly contacts upper surfaces of the first and second conductive structures and directly contacts the second dielectric layer.

13. The device of claim 12, wherein the first and second conductive structures each have sidewall surfaces directly contacting the first and second dielectric layers.

14. The device of claim 12, wherein the first dielectric layer is silicon dioxide, and the second dielectric layer comprises one of SiCOH, SiNCH, or SiN.

15. The device of claim 12, wherein the second dielectric layer comprises a second cap layer that directly contacts the first dielectric layer and the first and second conductive structures, wherein the first cap layer is formed above and directly contacts the second cap layer.

16. The device of claim 15, wherein the first cap layer is an extension of the second cap layer, wherein a first concentration of carbon or nitrogen in the first cap layer is less than a second concentration of the carbon or nitrogen in the second cap layer.

17. The device of claim 12, wherein a concentration of the carbon or nitrogen in the second dielectric layer is between 10% and 50% by atomic species.

18. A device, comprising:
    a first dielectric layer;
    first and second conductive structures comprising cobalt embedded in the first dielectric layer;
    a second cap layer positioned above an uppermost surface of the first dielectric layer, wherein the second cap layer directly contacts the first dielectric layer adjacent uppermost surfaces of the first and second conductive structures and directly contacts the first and second conductive structures, wherein the first dielectric layer and the second cap layer comprise different materials, and a portion of the second cap layer comprises a second concentration carbon or nitrogen; and
    a first cap layer positioned above and directly contacting the first and second conductive structures and above and directly contacting the second cap layer, wherein the first cap layer comprises a first concentration of carbon or nitrogen and the first cap layer is an extension of the second cap layer and wherein the first concentration of carbon or nitrogen in the first cap layer is less than the second concentration of the carbon or nitrogen in the second cap layer.

* * * * *